US011626229B2

(12) United States Patent
Kazemi et al.

(10) Patent No.: US 11,626,229 B2
(45) Date of Patent: Apr. 11, 2023

(54) SWITCHING OF PERPENDICULARLY MAGNETIZED NANOMAGNETS WITH SPIN-ORBIT TORQUES IN THE ABSENCE OF EXTERNAL MAGNETIC FIELDS

(71) Applicant: University of Rochester, Rochester, NY (US)

(72) Inventors: Mohammad Kazemi, Rochester, NY (US); Eby G. Friedman, Rochester, NY (US); Engin Ipek, Rochester, NY (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 17/231,277

(22) Filed: Apr. 15, 2021

(65) Prior Publication Data
US 2021/0319939 A1 Oct. 14, 2021

Related U.S. Application Data

(63) Continuation of application No. 16/710,531, filed on Dec. 11, 2019, now Pat. No. 11,004,588, which is a
(Continued)

(51) Int. Cl.
*H01F 10/32* (2006.01)
*G11C 11/16* (2006.01)
(Continued)

(52) U.S. Cl.
CPC ........ *H01F 10/3286* (2013.01); *G11C 11/161* (2013.01); *G11C 11/1675* (2013.01);
(Continued)

(58) Field of Classification Search
CPC ... G11C 11/1675; G11C 11/161; G11C 11/18; H01F 10/329; H01F 10/3285; H03K 19/18; H01L 43/10; H01L 43/065; H01L 43/00
See application file for complete search history.

(56) References Cited

U.S. PATENT DOCUMENTS

| 8,659,938 B2 * | 2/2014 | Prejbeanu ............... G11C 11/16 365/158 |
| 9,076,537 B2 * | 7/2015 | Khvalkovskiy ....... H01L 27/228 |

(Continued)

FOREIGN PATENT DOCUMENTS

| WO | WO-2009136454 A1 | 11/2009 |
| WO | WO-2014089182 A1 | 6/2014 |
| WO | WO-2015116416 A1 | 8/2015 |

OTHER PUBLICATIONS

ISA/European Patent Office, International Search Report and Written Opinion for Corresponding International Application No. PCT/US2016/028045, dated Jan. 20, 2017 (10 pgs).

*Primary Examiner* — Vanthu T Nguyen

(57) ABSTRACT

A method of controlling a trajectory of a perpendicular magnetization switching of a ferromagnetic layer using spin-orbit torques in the absence of any external magnetic field includes: injecting a charge current $J_e$ through a heavy-metal thin film disposed adjacent to a ferromagnetic layer to produce spin torques which drive a magnetization M out of an equilibrium state towards an in-plane of a nanomagnet; turning the charge current $J_e$ off after $t_e$ seconds, where an effective field experienced by the magnetization of the ferromagnetic layer $H_{eff}$ is significantly dominated by and in-plane anisotropy $H_{kx}$, and where M passes a hard axis by precessing around the $H_{eff}$; and passing the hard axis, where $H_{eff}$ is dominated by a perpendicular-to-the-plane anisotropy $H_{kz}$, and where M is pulled towards the new equilibrium
(Continued)

state by precessing and damping around $H_{eff}$, completing a magnetization switching.

2 Claims, 5 Drawing Sheets

Related U.S. Application Data continuation of application No. 15/572,017, filed as application No. PCT/US2016/028045 on Apr. 18, 2016, now Pat. No. 10,510,474.

(60) Provisional application No. 62/158,805, filed on May 8, 2015.

(51) Int. Cl.
| | |
|---|---|
| *H03K 19/18* | (2006.01) |
| *H01L 43/00* | (2006.01) |
| *H01L 43/04* | (2006.01) |
| *H01L 43/06* | (2006.01) |
| *G11C 11/18* | (2006.01) |
| *H01L 43/10* | (2006.01) |

(52) U.S. Cl.
CPC ............ *G11C 11/18* (2013.01); *H01F 10/329* (2013.01); *H01L 43/00* (2013.01); *H01L 43/04* (2013.01); *H01L 43/06* (2013.01); *H01L 43/065* (2013.01); *H01L 43/10* (2013.01); *H03K 19/18* (2013.01); *Y10S 148/109* (2013.01)

(56) References Cited

U.S. PATENT DOCUMENTS

| | | |
|---|---|---|
| 9,171,601 B2 | 10/2015 | Shukh |
| 9,230,626 B2 * | 1/2016 | Buhrman ................ H01L 43/08 |
| 9,300,301 B2 | 3/2016 | Bromberg et al. |
| 2007/0077664 A1 | 4/2007 | Chung et al. |
| 2011/0234216 A1 | 9/2011 | Nakamura et al. |
| 2014/0169088 A1 | 6/2014 | Buhrman et al. |
| 2015/0097159 A1 | 4/2015 | Apalkov et al. |

* cited by examiner

SWITCHING OF PERPENDICULARLY MAGNETIZED NANOMAGNETS WITH SPIN-ORBIT TORQUES IN THE ABSENCE OF EXTERNAL MAGNETIC FIELDS

CROSS-REFERENCE TO RELATED APPLICATIONS

This application is a continuation of co-pending U.S. patent application Ser. No. 16/710,531 SWITCHING OF PERPENDICULARLY MAGNETIZED NANOMAGNETS WITH SPIN-ORBIT TORQUES IN THE ABSENCE OF EXTERNAL MAGNETIC FIELDS, filed Dec. 11, 2019, and claims priority to U.S. patent application Ser. No. 16/710,531, U.S. patent application Ser. No. 15/572,017, SWITCHING OF PERPENDICULARLY MAGNETIZED NANOMAGNETS WITH SPIN-ORBIT TORQUES IN THE ABSENCE OF EXTERNAL MAGNETIC FIELDS, filed Nov. 6, 2017, PCT Application No. PCT/US16/28045, filed Apr. 18, 2016, SWITCHING OF PERPENDICULARLY MAGNETIZED NANOMAGNETS WITH SPIN-ORBIT TORQUES IN THE ABSENCE OF EXTERNAL MAGNETIC FIELDS, published as WO2016190984 A2, which claims priority to and the benefit of U.S. provisional patent application Ser. No. 62/158,805, SWITCHING OF PERPENDICULARLY MAGNETIZED NANOMAGNETS WITH SPIN-ORBIT TORQUES IN THE ABSENCE OF EXTERNAL MAGNETIC FIELDS, filed May 8, 2015, which applications are incorporated herein by reference in their entirety.

STATEMENT REGARDING FEDERALLY FUNDED RESEARCH OR DEVELOPMENT

This invention was made with Government Support under W911NF-14-C-0089 awarded by the Department of Defense. The Government has certain rights in the invention.

FIELD OF THE APPLICATION

The application relates to switching the magnetization of nanomagnets and particularly to a base element structure and method for switching the magnetization of nanomagnets.

BACKGROUND

Complementary metal-oxide-semiconductor (CMOS) technologies are prevalent today in memory and logic systems. However, CMOS technologies no longer provide a desired balance of fast operation, high density integration, and energy efficiency.

SUMMARY

A method of controlling a trajectory of a perpendicular magnetization switching of a ferromagnetic layer using spin-orbit torques in the absence of any external magnetic field includes: injecting a charge current $J_e$ through a heavy-metal thin film disposed adjacent to a ferromagnetic layer to produce spin torques which drive a magnetization M out of an equilibrium state towards an in-plane of a nanomagnet; turning the charge current $J_e$ off after $t_e$ seconds, causing a spin torque to reduce to substantially zero where M is close to an x-y plane and away from an $e_z$ axis by an angle of $\vartheta$ in a critical zone, where an effective field experienced by the magnetization of the ferromagnetic layer $H_{\textit{eff}}$ is significantly dominated by and in-plane anisotropy $H_{kx}$, and where M passes a hard axis by precessing around the $H_{\textit{eff}}$; and passing the hard axis, where $H_{\textit{eff}}$ is dominated by a perpendicular-to-the-plane anisotropy $H_{kz}$, and where M is pulled towards the new equilibrium state by precessing and damping around $H_{\textit{eff}}$, completing a magnetization switching.

The duration of the $t_e$ of an applied current pulse includes a shortest time which causes the magnetization M to move from the equilibrium state to the critical zone.

The foregoing and other aspects, features, and advantages of the application will become more apparent from the following description and from the claims.

BRIEF DESCRIPTION OF THE DRAWINGS

The features of the application can be better understood with reference to the drawings described below, and the claims. The drawings are not necessarily to scale, emphasis instead generally being placed upon illustrating the principles described herein. In the drawings, like numerals are used to indicate like parts throughout the various views.

DETAILED DESCRIPTION

Figure 1:
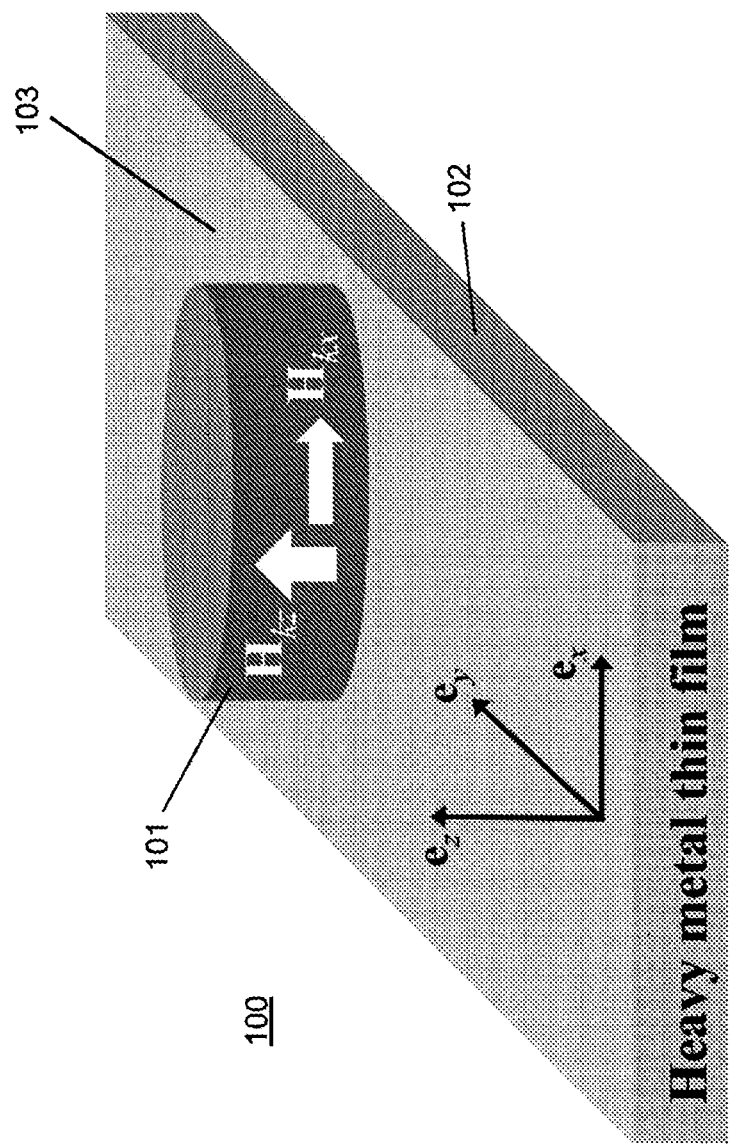
FIG. 1 is a drawing showing a ferromagnetic layer adjacent to a heavy-metal nonmagnetic nanostrip.

Magnetization switching of ferromagnets using spin-orbit torques provides opportunities to introduce nanomagnets into high performance logic and memory applications requiring low power consumption. Nanomagnets with perpendicular-to-the-plane anisotropy have recently attracted a considerable attention due to their high thermal stability. High stability against thermal fluctuations allows nanomagnets to be deeply scaled down, resulting in dense logic and memory systems with ultra-low power consumption. However, due to the symmetric energy landscape experienced by the magnetization of a nanomagnet with perpendicular-to-the-plane anisotropy, spin-orbit torques induced by an in-plane current pulse cannot switch the magnetization. An external magnetic field is, therefore, required to assist spin-orbit torques by breaking the symmetry. Although the energy dissipated by switching a nanomagnet could be small, the energy necessary to generate the required magnetic field makes the overall memory or logic scheme uncompetitive as compared to complementary metal-oxide-semiconductor (CMOS) counterparts. Additional metals are also necessary to produce the required magnetic field, significantly decrease the number of devices which can be integrated over a given area. Therefore, the need for an external magnetic field is an obstacle for developing dense low power memory and logic systems. Furthermore, fast switching requires higher energy to be injected through the ferromagnet and/or metals producing magnetic field. Since the required energy grows significantly as the desired switching speed increases, fast operation compromises the energy efficiency.

A solution to the problems described hereinabove switches the magnetization of a nanomagnet with perpendicular-to-the-plane anisotropy using spin-orbit torques induced by an in-plane current pulse without the presence of an external magnetic field.

The solution includes a scheme to switch the magnetization of a nanomagnet with perpendicular-to-the-plane anisotropy using spin-orbit torques induced by an in-plane current pulse without the presence of an external magnetic field. It was realized that magnetization switching can be achieved by breaking the symmetry by introducing an in-plane anisotropy into the nanomagnet. We describe how spin orbit torques induced by an in-plane current pulse of appropriate amplitude and duration are sufficient to switch the magnetization of the nanomagnet in absence of an external magnetic field. For a given ratio between the in-plane and perpendicular-to-the-plane anisotropies, high switching probability (deterministic switching) is achievable for current pulses of significantly short duration by balancing the spin-orbit and damping torques, resulting in ultra-fast switching. Furthermore, since external magnetic field is not required for magnetization switching within the described scheme, energy efficiency and integration density is significantly improved, resulting in ultra-fast dense memory and low power consumption logic systems.

FIG. 1 shows an exemplary ferromagnetic layer including a perpendicular-to-the-plane anisotropy ($H_{kz}$) and an in-plane anisotropy ($H_{kx}$) is situated on a heavy-metal nanostrip. In one exemplary embodiment, the proposed structure of base element 100, FIG. 1 shows a ferromagnetic layer represented by a Stoner-Wohlfarth monodomain magnetic body 101 with magnetization M, situated at a heavy-metal nonmagnetic nanostrip 102 with strong spin-orbit coupling. The ferromagnetic layer, as shown in FIG. 1, includes a perpendicular-to-the-plane uniaxial anisotropy $H_{kz}$ along the $e_z$ axis and an in-plane uniaxial anisotropy $H_{kx}$ along the $e_x$ axis.

Figure 2:
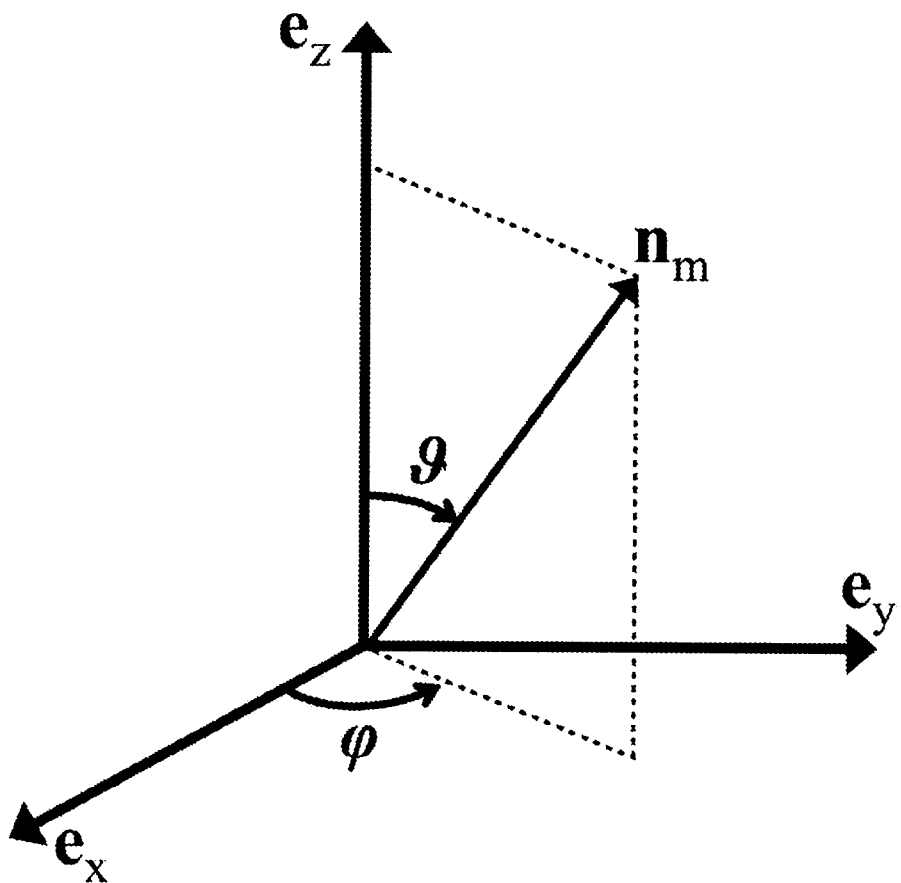
FIG. 2 is a drawing showing how the dynamics of the magnetization motion can be captured by $\vartheta$ and $\varphi$.

FIG. 2 shows how the dynamics of the magnetization motion can be captured by $\vartheta$ and $\varphi$. As shown in FIG. 2, the motion of M is represented by a unit vector $n_m$, which makes an angle $\vartheta$ with $e_z$ axis, while the plane of M and $e_z$ makes an angle $\varphi$ with $e_x$.

Figure 3B:
FIG. 3B is a drawing showing an exemplary elliptical ferromagnet having an in-plane anisotropy $H_{kx}$.
Figure 3C:
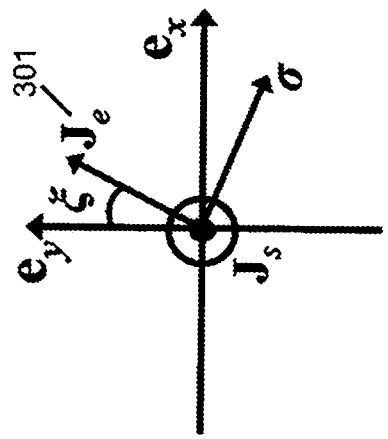
FIG. 3C is a drawing that shows the charge current direction and orientation of the spin polarization $\sigma$ with respect to $H_{kx}$.
Figure 3A:
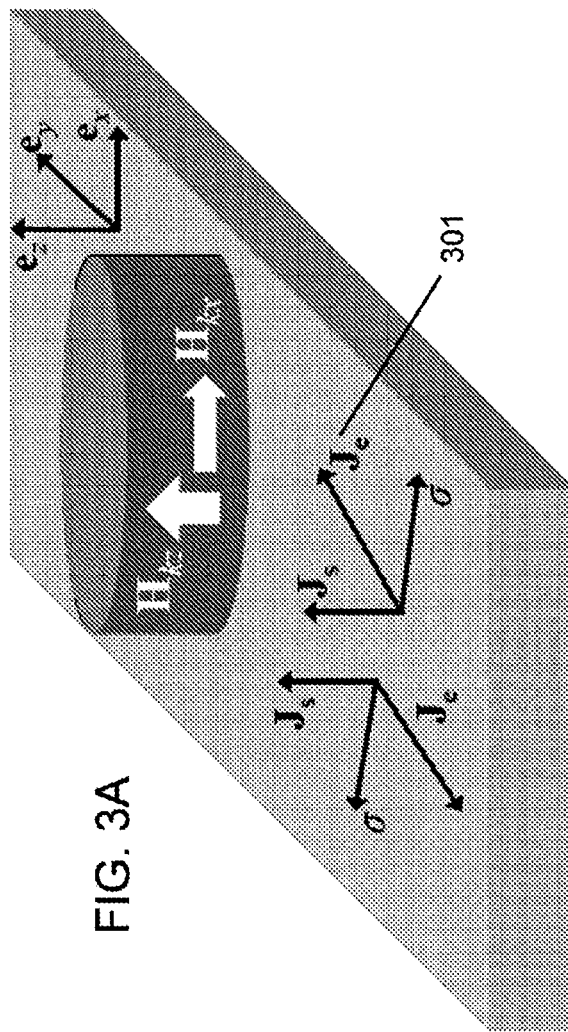
FIG. 3A is a drawing showing that the charge current ($J_e$) injected through the nonmagnetic heavy-metal induces spin current ($J_s$)

FIG. 3A shows that the charge current ($J_e$) injected through the nonmagnetic heavy-metal induces spin current ($J_s$). As shown in FIG. 3A, a charge current $J_e$, injected through the heavy-metal nanostrip, produces a traverse spin current $J_s = \theta_{SH}(\sigma \times J_e)$ due to the spin-orbit interaction, where $J_e$ is the charge current density, $\sigma$ is the spin polarization unit vector, and $\theta_{SH}$ is the material dependent spin Hall angle.

FIG. 3B shows an illustration of an exemplary elliptical ferromagnet having an in-plane anisotropy $H_{kx}$.

FIG. 3C shows the charge current direction 301 and orientation of the spin polarization $\sigma$ with respect to the $H_{kx}$. As shown in FIG. 3C, the direction of the charge current $J_e$ makes an angle of $\xi$ with $e_y$ axis. Spin polarized current transports spin angular momentum into the nanomagnet, exerting a torque on the magnetization. The dynamics of M under the influence of torques and anisotropy fields is described using the Landau-Lifshitz-Gilbert (LLG) equation as $$\frac{dn_m}{dt} = -\gamma(n_m \times H_{\mathit{eff}}) + \alpha\left(n_m \times \frac{dn_m}{dt}\right) + \gamma T_{ST}, \quad (1)$$

where $\gamma$ is the gyromagnetic ratio, $\alpha$ is the damping factor, $T_{ST}$ is the spin torque, and $H_{\mathit{eff}}$ is the effective field experienced by the magnetization of the ferromagnetic layer. $H_{\mathit{eff}}$ is a function of $H_{kx}$ and $H_{kz}$. The spin torque has two components, referred to as the in-plane and out-of-plane torques: $T_{ST} = T_{IP} + T_{OOP}$.

Figure 4:
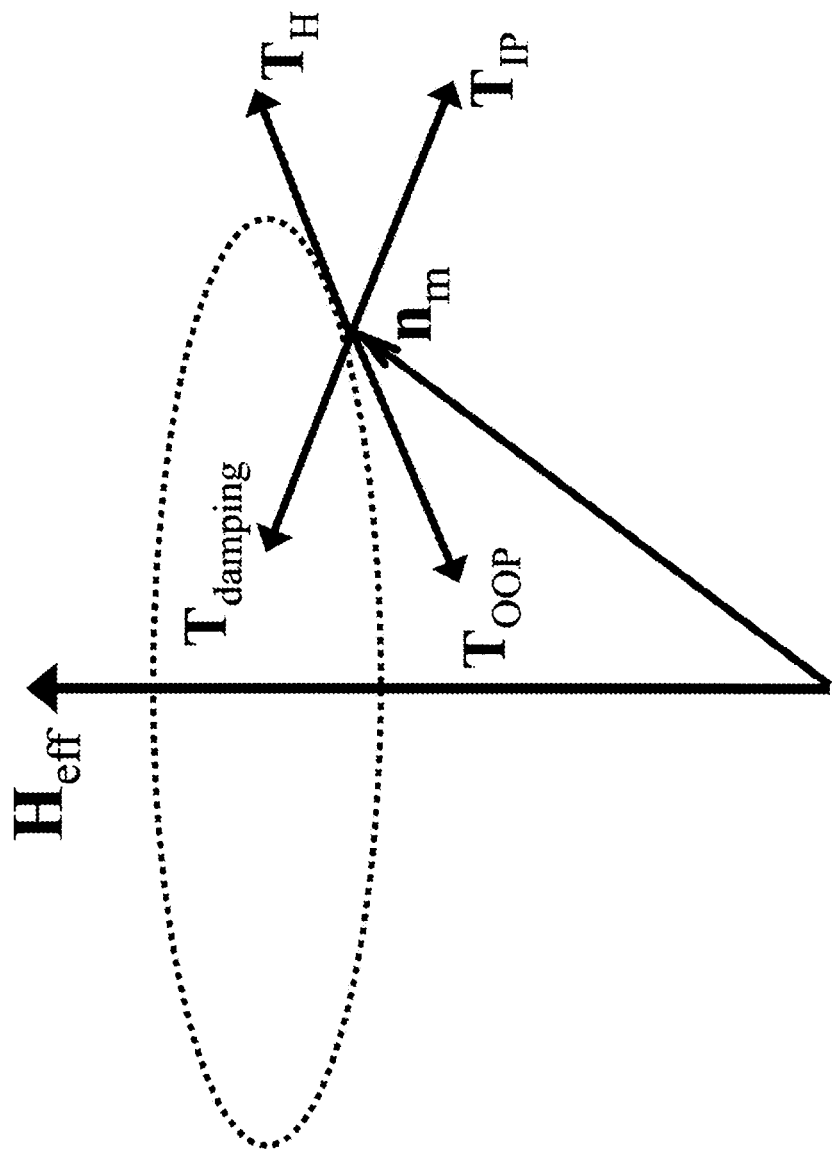
FIG. 4 is a drawing showing the motion of magnetization under the influence of spin-torques and anisotropies.

FIG. 4 shows the motion of magnetization under the influence of spin-torques and anisotropies. As demonstrated in FIG. 4, the in-plane torque $T_{IP}$ lies in the plane defined by M and $H_{\mathit{eff}}$, and the out-of-plane torque $T_{OOP}$ points out of the plane defined by M and $H_{\mathit{eff}}$.

Figure 5:
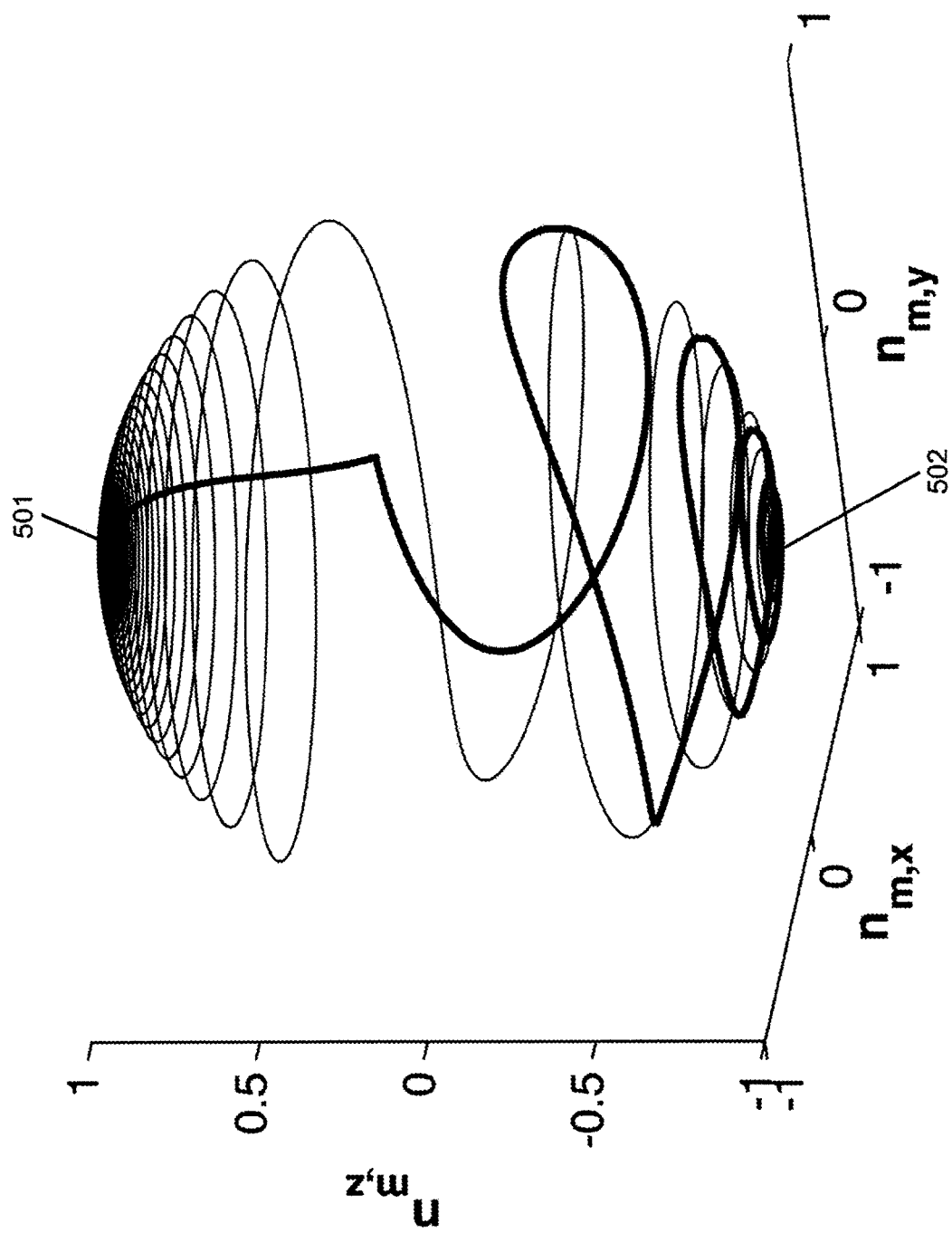
FIG. 5 is a drawing showing the trajectory of the magnetization switching of a ferromagnetic layer using spin-orbit torques in the absence of an external magnetic field.

FIG. 5 shows the trajectory of the magnetization switching of a ferromagnetic layer using spin-orbit torques in the absence of any external magnetic field. As shown in FIG. 5, by injecting charge current $J_e$ through the heavy-metal nonmagnetic nanostrip, produced spin torques derive M out of the equilibrium position (also called an equilibrium state) toward the in-plane of the nanomagnet. By turning the charge current $J_e$ off after $t_e$ seconds, spin torque reduces to zero and M is close to the x-y plane and away from the $e_z$ axis by an angle of $\vartheta$. At this zone, referred here to as the critical zone, $H_{\mathit{eff}}$ is significantly dominated by $H_{kx}$. Therefore, M passes the hard axis by precessing around the $H_{\mathit{eff}}$. By passing the hard axis, $H_{\mathit{eff}}$ is dominated by $H_{kz}$. Hence, M is pulled towards the new equilibrium state by precessing and damping around $H_{\mathit{eff}}$, completing the magnetization switching.

The duration $t_e$ of the applied current pulse is as short as the time which causes the magnetization M to move from the equilibrium state to the critical zone. The magnetization switching can be performed using current pulses of a duration of sub-50 ps. Therefore, the proposed scheme significantly improves the switching speed and/or reduces the energy consumption, resulting in ultra-high-speed spin-torque memory and logic systems which have significantly low energy consumption. Furthermore, as no extra metal is required for producing an external magnetic field, integration density is considerably enhanced.

It is contemplated that both switching energy and switching speed can be determined by the angle $\xi$. It is also contemplated that there is a tradeoff between switching energy and switching speed as can be set by the angle $\xi$.

Heavy-metals as used hereinabove include any suitable transition metals having a large atomic number, such as, for example, tungsten (W), tantalum (Ta), Aluminum (Al), Gold (Au), Bismuth (Bi), Molybdenum (Mo), Niobium (Nb), Palladium (Pd), or Platinum (Pt). Also included are any suitable metal alloys, such as, for example, an alloy of copper (Cu) and Bi, or an alloy of Cu and iridium (Ir). By injecting a charge current through a heavy-metal thin film of any suitable metal or metal alloy as listed hereinabove, a traverse spin current is produced due to strong spin-orbit coupling. As described hereinabove, the produced spin current may be used to switch the direction of the magnetization of a nanomagnet. By injecting a charge current through a heavy-metal thin film, a traverse spin current is produced due to strong spin-orbit coupling. The produced spin current may be used to switch the direction of the magnetization of a nanomagnet. The magnitude of the produced spin current is directly proportional to the spin Hall angle of a thin film heavy-metal. Large spin Hall angles have been observed in some high resistivity thin films of heavy-metals. It has been shown both experimentally and theoretically that the magnitude of the spin Hall angle in some thin film heavy-metals such as, for example, thin films of W is directly proportional to the resistivity (thickness) of the thin film. For example, it has been observed that by increasing the thickness of a thin film of tungsten from 5.2 nm to 15 nm, the spin Hall angle drops from 0.33 to less than 0.07.

The magnitude of the produced spin current is directly proportional to the spin Hall angle of a thin film heavy-metal. Large spin Hall angles have been observed in some high resistivity thin films of heavy-metals. It has been shown both experimentally and theoretically that the magnitude of the measured (calculated) spin Hall angle in thin film heavy-metals is directly proportional to the resistivity (thickness) of the thin film. For example, it has been observed that by increasing the thickness of a thin film of tungsten from 5.2 nm to 15 nm, the spin Hall angle drops from 0.33 to less than 0.07.

In summary with reference to the exemplary embodiment of FIG. 1, a base element 100 for switching a magnetization state of a nanomagnet 101 includes a heavy-metal strip 102 having a surface 103. The ferromagnetic nanomagnet 101 is disposed adjacent to the surface 103 of the heavy-metal strip 102. The ferromagnetic nanomagnet 101 has a first magnetization equilibrium state 501 and a second magnetization equilibrium state 502 (also referred to in some embodiments as an upward equilibrium state and a downward equilibrium state). The first magnetization equilibrium state 501 or the second magnetization equilibrium state 502 is settable by a flow of electrical charge having an electrical charge current direction 301 through the heavy-metal strip. The ferromagnetic nanomagnet can also be a feature of a magnetic layer in an integrated device incorporating the base element.

In some embodiments, by causing a flow of charge (current) in the heavy-metal strip as described hereinabove the magnetization of the nanomagnet can be switched between a first equilibrium state and a second equilibrium state, such as by reversing the direction of the flow of charge. In some contemplated applications, such as, for example where the structure is a base element of a memory or a logic system, the first equilibrium state can be assigned to either a Boolean "0" or a "1" and the second equilibrium state can be assigned to the other Boolean number different from the first equilibrium state. In such contemplated applications, the method to change the magnetization as described hereinabove is analogous to a "write" operation.

Also, in such contemplated applications, methods for reading the magnetization state of a base element are known, such as, for example, by adding an insulating layer over the nanomagnet and another magnetic layer having a fixed magnetization over the insulating layer. When the nanomagnet is switched to a magnetization equilibrium state about parallel to the magnetization of the fixed magnetization magnetic layer, there will be a low electrical resistance between the magnetic layer having a fixed magnetization and the magnetic layer having a switchable magnetization. Conversely, when the nanomagnet is switched to a magnetization equilibrium state about anti-parallel to the magnetization of the fixed magnetization magnetic layer, there will be a high electrical resistance between the magnetic layer having a fixed magnetization and the magnetic layer having a switchable magnetization. Thus, in some embodiments, a "read" operation to determine the magnetization state of the base element (e.g. a single "bit") can be performed by sensing a low resistance or a high resistance.

It is contemplated that the base element described hereinabove can be used as a bit of an integrated device, such as, for example, a memory device or a logic device. In such applications, techniques of integration known in the art can be used to form and interconnect a plurality of such base elements. It is contemplated that billions of such base elements with nanomagnets of an integrated magnetic layer can be integrated into a single integrated device. Internal integrated electrical connections between base elements can be made using integrated circuit interconnection techniques known in the art.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method of controlling a trajectory of a perpendicular magnetization switching of a ferromagnetic layer using spin-orbit torques in the absence of any external magnetic field comprising:

injecting a charge current $J_e$ through a heavy-metal thin film disposed adjacent to a nanomagnet comprising a shape having a long axis and a short axis of a ferromagnetic layer to produce spin torques which drive a magnetization M out of an equilibrium state towards an in-plane of a nanomagnet, a flow of electrical charge of said charge current $J_e$ non-perpendicular to said short axis of said nanomagnet;

turning said charge current $J_e$ off after $t_e$ seconds, causing a spin torque to reduce to substantially zero where M is close to an x-y plane and away from an $e_z$ axis by an angle of $\vartheta$ in a critical zone, where an effective field experienced by the magnetization of the ferromagnetic layer $H_{eff}$ is significantly dominated by and in-plane anisotropy $H_{kx}$, and where M passes a hard axis by precessing around said $H_{eff}$; and passing the hard axis, where $H_{eff}$ is dominated by a perpendicular-to-the-plane anisotropy $H_{kz}$, and where M is pulled towards the new equilibrium state by precessing and damping around $H_{eff}$, completing a magnetization switching.

2. The method of claim 1, wherein a duration of said $t_e$ of an applied current pulse comprises a shortest time which causes said magnetization M to move from said equilibrium state to said critical zone.

* * * * *